United States Patent
Bhattacharyya

(10) Patent No.: US 8,242,554 B2
(45) Date of Patent: Aug. 14, 2012

(54) INTEGRATED TWO DEVICE NON-VOLATILE MEMORY

(75) Inventor: Arup Bhattacharyya, Essex Junction, VT (US)

(73) Assignee: Micron Technology, Inc., Boise, ID (US)

(*) Notice: Subject to any disclaimer, the term of this patent is extended or adjusted under 35 U.S.C. 154(b) by 130 days.

(21) Appl. No.: 12/582,024

(22) Filed: Oct. 20, 2009

(65) Prior Publication Data

US 2010/0038701 A1    Feb. 18, 2010

Related U.S. Application Data

(62) Division of application No. 11/018,131, filed on Dec. 21, 2004, now abandoned.

(51) Int. Cl.
*H01L 29/792* (2006.01)

(52) U.S. Cl. ..... 257/326; 257/316; 257/324; 257/E29.3; 257/E29.304

(58) Field of Classification Search .......... 257/316, 257/319–322, 324, 326, E29.129, E29.3, 257/E29.304–E29.306
See application file for complete search history.

(56) References Cited

U.S. PATENT DOCUMENTS

| | | |
|---|---|---|
| 4,707,721 A | 11/1987 | Ang et al. |
| 4,870,470 A | 9/1989 | Bass, Jr. et al. |
| 6,518,589 B2 | 2/2003 | King |
| 6,664,601 B1 | 12/2003 | King |
| 6,686,267 B1 | 2/2004 | King |
| 6,743,681 B2 | 6/2004 | Bhattacharyya |
| 7,230,295 B2* | 6/2007 | Ding .............................. 257/314 |
| 2003/0042534 A1 | 3/2003 | Bhattacharyya |
| 2003/0122204 A1 | 7/2003 | Nomoto et al. |
| 2003/0142550 A1* | 7/2003 | Kawahara et al. ....... 365/185.28 |
| 2004/0058523 A1 | 3/2004 | Li et al. |
| 2004/0080999 A1 | 4/2004 | Madurawe |
| 2005/0167730 A1 | 8/2005 | Lee et al. |
| 2005/0266638 A1* | 12/2005 | Cho et al. ...................... 438/257 |
| 2006/0194438 A1 | 8/2006 | Rao et al. |

OTHER PUBLICATIONS

Lee et al., *A Novel SONOS Structure of SiO₂/SiN/Al₂O₃ with TaN metal gate for multi-giga bit flash memeries*, Samsung Electronics Co., Ltd., 2003, pp. 26.5.1-26.5.4.

DiMaria et al., *Enhanced conduction and minimized charge trapping in electrically alterable read-only memories using off-stoichiometric silicon dioxide films*, American Insitiute of Physics, Oct. 13, 1983, pp. 3000-3019.

(Continued)

*Primary Examiner* — Matthew E Warren
(74) *Attorney, Agent, or Firm* — Leffert Jay & Polglaze, P.A.

(57) ABSTRACT

The non-volatile memory cell is comprised of the series integration of a fixed threshold element and a bistable element. The fixed threshold element is formed over a substrate with a gate insulator layer and an access gate having a nitride layer. The bistable element is formed adjacent to the fixed threshold element by a tunnel insulator over the substrate, a charge trapping layer over the tunnel insulator, a charge blocking layer over the trapping layer, and a control gate, having a nitride layer, over the charge blocking layer. In one embodiment, the gate insulator, tunnel insulator and charge trapping layers are all SiON with thicknesses that depend on the designed programming voltage. The control gate can be formed overlapping the access gate or the access gate can be formed overlapping the control gate.

15 Claims, 5 Drawing Sheets

OTHER PUBLICATIONS

Muralidhar et al., *A 6V Embedded 90nm Silicon Nanocrystal Nonvolatile Memory*, Digital DNA Laboratories and the embedded Memory Center, Motorola, 2003, pp. 26.2.1-26.2.4.

Tiwari et al., *Volatile and Non-Volatile Memories in Silicon with Nano-Crystal Storage*, IBM Research Division, 1995, pp. 20.4.1-20.4.4.

Takata et al., *New Non-Volatile Memory with Extremely High Density Metal Nano-Dots*, Department of Bioengineering and Robotics, Tohoku University, Japan, 03, pp. 22.5.1-22.5.4.

Nakajima et al., *Atomic-Layer-Deposited Ultrathin Si-Nitride Gate Dielectrics—A Better Choice for Sub-tunneling Gate Dielectrics-*, Research Center for Nanodevices and Systems, Hiroshima University, Japan, 2003, pp. 28.2.1-28.2-4.

Baik et al., *High Speed and Nonvolatile Si Nonocrystal Memory for Scaled Flash Technology using Highly Field-Sensitive Tunnel Barrier*, Process Development Team, Samsung Electronics, 2003, pp. 22.3.1-22.3.4.

Guarini et al., *Low voltage, scalable nanocrystal FLASH memory fabricated by templated self assembly*, IBM Semiconductor Research and Development Center, 2003, pp. 22.2.1-22.2.4.

Yeh et al., *Novel Operation Schemes to Improve Device Reliability in a Localized Trapping Storage SONOS-type Flash Memory*, Technology Development Center Macronix Intl., 2003, pp. 7.5.1-7.5.4.

Fukuda et al., *Scaled 2 bit/cell SONOS Type Nonvolatile Memory Technology for sub-90nm Embedded Application using SiN Sidewall Trapping Structure*, Fujitsu Laboratories Ltd., 2003, pp. 37.5.1-37.5.4.

Cho et al., *High Performance SONOS Memory Cells Free of Drain Turn-On and Over-Erase: Compatibility Issue with Current Flash Technology*, IEEE Electron Device Letters, vol. 21, No. 8, Aug. 2000, pp. 399-401.

\* cited by examiner

INTEGRATED TWO DEVICE NON-VOLATILE MEMORY

RELATED APPLICATION

This Application is a Divisional of U.S. application Ser. No. 11/018,131, titled "INTEGRATED TWO DEVICE NON-VOLATILE MEMORY," filed Dec. 21, 2004 now abandoned, which is commonly assigned and incorporated herein by reference.

TECHNICAL FIELD

The present invention relates generally to memory devices and in particular the present invention relates to non-volatile memory devices

BACKGROUND OF THE INVENTION

Memory devices are typically provided as internal, semiconductor, integrated circuits in computers or other electronic devices. There are many different types of memory including random-access memory (RAM), read only memory (ROM), synchronous dynamic random access memory (SDRAM), dynamic random access memory (DRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Conventional non-volatile memory cells employ floating gate device technology. A floating gate cell can be programmed by injecting electrons to the silicon floating gate by channel hot carrier injection (CHE) to put the cell into a high threshold state. The cell can be erased by hot hole injection from the substrate plus electron back-tunneling to the substrate by Fowler-Nordheim tunneling to put the cell in a low threshold state. Both mechanisms require high fields across the gate dielectric layers with resulting adverse effects in device characteristics and reliability.

CHE can consume large amounts of power for writing, generates interface states, degrades device transconductance, and enhances back-tunneling that affects charge retention and read-disturb. Fowler-Nordheim tunneling and associated hot-hole injection generates fixed charge centers in tunneling dielectrics and shallow traps and defects in the trapping layer, thus breaking stable bonds and eventually degrading the dielectric properties of the device.

As computers become smaller and their performance increases, the computer memories have also gone through a corresponding size reduction and performance increase. However, flash memory devices present a challenge in scalability due, at least in part, to the high programming voltages typically required. Their performance can also suffer due to the above-discussed limitations.

For the reasons stated above, and for other reasons stated below which will become apparent to those skilled in the art upon reading and understanding the present specification, there is a need in the art for a more scalable, higher performance non-volatile memory device.

DETAILED DESCRIPTION

Figure 1:
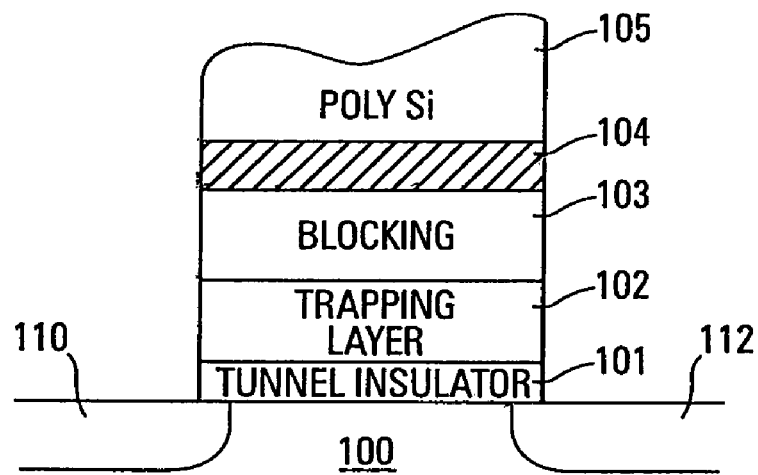
FIG. 1 shows a cross-sectional view of one embodiment of a gate insulator stack of a bi-stable element of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

FIG. 1 illustrates a cross-sectional view of one embodiment of a gate insulator stack of a bi-stable element of the present invention. The stack architecture provides the capability of storing multiple bits per memory element without the need to switch the biasing of the cell's drain and source regions. This is accomplished by varying the trapping density of the trapping layer.

A tunnel insulator layer 101 is formed over the substrate 100 that, in one embodiment, is comprised of p-type silicon. An alternate embodiment may use an n-type material. The substrate 100 has doped regions 110 and 112 that are used as source and drain regions.

In one embodiment, the tunnel insulator 101 is formed from silicon oxynitride (SiON). The SiON provides good back-tunneling characteristics in order to prevent a charge from leaking back to the substrate 100. Alternate embodiments may use other materials such as another oxynitride material or an oxide material. As discussed subsequently, the tunnel insulator 101 is a common element between the bistable element and the fixed threshold element of the present invention.

The tunnel insulator 101 can be formed over the substrate 100 using an atomic layer deposition (ALD) technique to produce a thickness, in one embodiment, in the range of 2-5 nm, an effective oxide thickness (EOT) of 1-2.5 nm. The actual desired thickness depends on the power supply ($V_{DD}$) and the programming voltage ($V_{pp}$) requirements. The 2-5 nm range is appropriate for a $V_{DD}$ of 1.0-2.5V. A thickness of less than 2.5 nm typically enables the element to operate in the direct tunneling regime. Alternate embodiments that use other power supply voltages would use different insulator material and thicknesses.

In one embodiment, an SiON tunnel insulator 101 is characterized to have a very low trap density of less than $1\times10^{11}$, an atomic concentration of nitrogen that is less than or equal to 20%, an atomic oxygen concentration of greater than or equal to 45%, and a refractive index of 1.55 to 1.65. These numbers are for purposes of illustration only.

A charge trapping layer 102 is formed over the tunnel insulator 101. The trapping layer 102 has a high trap density (e.g., $5\times10^{12}$ to $10\times10^{14}$). This layer 102 can be comprised of a high dielectric constant (high-K) material (e.g., $Al_2O_3$) with high-density metal nano-dots, silicon nano-crystals, a silicon rich insulator, or $SiON/Si_3N_4$ having a refractive indices range of 1.75-2.0. A typical thickness range for the trapping layer 102 is 4-6 nm. However, alternate embodiments may have other thickness ranges.

The high-density metal nano-dots embedded into a high dielectric constant insulator material. The embedded metal nano-dots are used as a charge retention layer for the non-volatile memory element. Each metal dot acts as an isolated, one-dimensional, small floating gate. Therefore, even if a charge leakage path exists between one small floating gate and the substrate or the control gate, the remaining nano-dots in the film layer retain the charge.

In one embodiment, the density range of the metal nano-dots in the trapping layer 102 is in the range of $5\times10^{12}$ to $10\times10^{13}$ with typical dot sizes in the range of 1-3 nm and spaced greater than 3 nm apart in the high-K dielectric material. Alternate embodiments can use different densities, dot sizes, and spacing.

The metal nano-dot elements can include platinum (Pt), gold (Au), Cobalt (Co), Iridium (Ir), Tungsten (W) or some other metal that provides deep energy electron and hole traps. In one embodiment, the metal nano-dot layer is deposited by sputtering or evaporation at relatively low temperatures.

A charge blocking insulator layer 103 is formed over the charge trapping layer 102. This layer 103 minimizes the programming voltage and field across the dielectric stack.

The blocking layer 103 is a high-K, high band gap dielectric medium that is characterized by a large energy barrier for electrons and holes. This provides a negligible field emission either from the trapping layer or from the metal control gate 105. This layer 103 may be comprised of alumina ($Al_2O_3$) having a K=10, hafnia ($HfO_2$) or Zirconia ($ZrO_2$) with a K=20, or Praeseodymium Oxide ($Pr_2O_3$) with a K=30. Alternate embodiments using high-K materials can also be used.

A typical thickness for the blocking layer 103 might be 2 times to 10 times the thickness of the tunnel insulator. The actual thickness depends on the design point of the programming voltage and the high threshold target of the bistable element. The physical thickness could vary between 5 and 25 nm.

A layer of tantalum nitride (TaN) 104 is formed over the blocking layer 103. This layer acts as a chemical passivation layer that is chemically inert. It provides protection of the lower layers from impurities imparted by subsequent processing. The layer 104 also acts as an etch stop layer for subsequent etching steps. In one embodiment, the TaN layer 104 is formed to a thickness in the range of 5-10 nm but should be formed sufficiently thin as possible to act effectively as a passivation layer. Alternate embodiments may use other materials, such as titanium nitride (TiN), and different thicknesses for this layer.

A control gate 105 is formed over the TaN layer 104. In one embodiment, the control gate 105 is a heavily doped polysilicon material. Alternate embodiments may use metal gates such as copper, tungsten, or some other metal.

Figure 2:
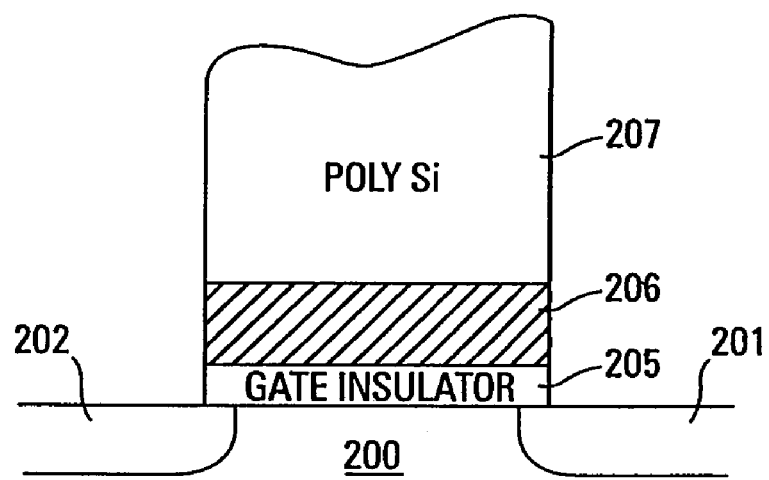
FIG. 2 shows a cross-sectional view of one embodiment of a gate insulator stack of a fixed threshold logic element of the present invention.

FIG. 2 illustrates a cross-sectional view of one embodiment of a fixed threshold logic element of the present invention. The fixed threshold element is formed over a substrate 200 that, in one embodiment, is comprised of p-type silicon. An alternate embodiment may use an n-type material. The substrate has doped regions 201 and 202 that are used as source and drain regions.

A gate insulator layer 205 is formed over the substrate 200. In one embodiment, the gate insulator 205 is formed of SiON using an atomic layer deposition (ALD) technique to produce a desired thickness, in one embodiment, in the range of 2-5 nm, an effective oxide thickness (EOT) of 1-2.5 nm. The actual desired thickness depends on the power supply ($V_{DD}$) requirement. The 2-5 nm range is appropriate for a $V_{DD}$ of 1.0-2.5V. A physical thickness of less than 3.0 nm typically enables the element to operate in the direct tunneling regime. Alternate embodiments that use other power supply voltages would use different insulator thicknesses. The fixed threshold element is designed to have a threshold typically around 0.6 V to 1.0 V to reduce stand-by leakage to a minimum.

A layer of tantalum nitride (TaN) 206 is formed over the gate insulator layer 205. This layer 206 acts as a chemical passivation layer that is chemically inert. It provides protection of the lower layers from impurities imparted by subsequent processing. The layer 206 also acts as an etch stop layer for subsequent etching steps. In one embodiment, the TaN layer 206 is formed to a thickness in the range of 5-10 nm but should be formed sufficiently thin as possible to act effectively as a passivation layer. Alternate embodiments may use other materials, such as titanium nitride (TiN), and different thicknesses for this layer.

A control gate 207 is formed over the TaN layer 206. In one embodiment, the control gate 105 is a doped polysilicon material. Alternate embodiments may use a metal gate such as copper, tungsten, or some other metal.

The following FIGS. 3-10 illustrate various embodiments using the bistable and fixed threshold gate stacks illustrated in FIGS. 1 and 2 respectively. These embodiments are for purposes of illustration. The present invention is not limited to any certain configuration.

The bistable gate insulator stack of the above embodiments might be comprised of any oxy-nitride tunnel layer 101 (refractive index=1.6, K=5.5), an oxy-nitride trapping layer 102 (refractive index=1.80, K=7), and an alumina charge blocking layer 103 (K=10) with a doped polysilicon gate 105 (alternately, TaN/Polysilicon). As discussed previously, many combinations of trapping layer and charge blocking layer are possible. A bistable gate insulator stack as illustrated in FIG. 1 with 2.2 nm tunnel layer/5 nm trapping layer SiON/ 12.5 nm charge blocking $Al_2O_3$ would have an EOT≦9.5 nm and a programming/erase voltage of nearly ±7.5V to achieve a high state threshold of greater than 3V with <<1 ms pulse width for programming.

Figure 7:
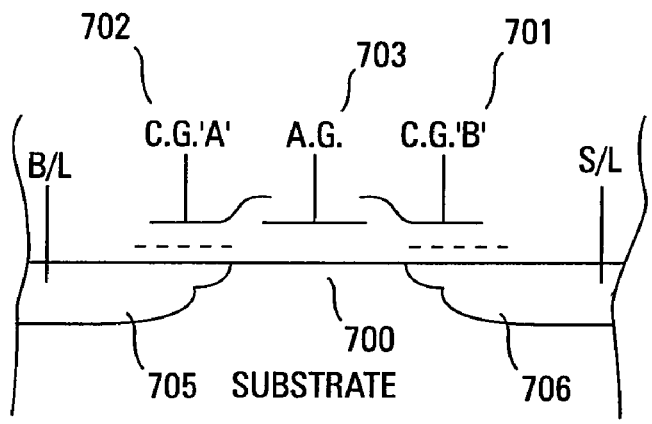
FIG. 7 shows another alternate embodiment of a non-volatile memory cell of the present invention.
Figure 8:
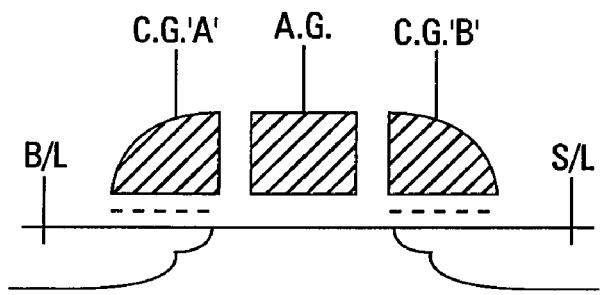
FIG. 8 shows another alternate embodiment of a non-volatile memory cell of the present invention.

For two bit operation of the cell, the memory cell would be comprised of two bistable elements such as shown in FIG. 7 or 8 each representing an appropriate high threshold state. The bistable elements may have the same $Al_2O_3$ thicknesses of 12.5 nm yielding a high $V_t$ each of +3.0 V with a programming pulse of +7.5V.

To improve the stability of the high threshold states for the above embodiments, a modified programming scheme can be used. In such a scheme, the programming pulse is comprised of a positive programming pulse of 0.1 ms at $V_{prog}$ with a $-V_{DD}$ (power supply) pulse of 1 ms. This programming scheme results in minimizing electron back tunneling from shallow trap centers.

Using the above gate insulator stacks, single bit NOR memory cells can be designed to have characteristics such as (for $V_{DD}$=2.5V): $V_{t-low}$=1.0V, $V_{t-high}$=3.0-4.0V, $V_{prog}$≦7.5V with a 0.1 ms pulse and a −2.5V pulse for 1 ms, $V_{erase}$=−6.0V with a pulse width of 1 ms. A retention time of 10 years is possible with an endurance of $1 \times 10^{14}$ cycles. Equivalent characteristics can be achieved for NAND cells with slower access times.

Similarly, the above gate insulator stacks can provide the following characteristics for a two bit NOR cell at the same $V_{DD}$=2.5V: $V_{t-low}$=1.0V, $V_{t-high}$-A=3.0V, Vt-high-B=3.0V, $V_{prog}$=7.5V with a 0.1 ms pulse and a −2.5V pulse for 1 ms, $V_{erase}$=−7.5V with a pulse width of 1 ms. A retention time of 10 years is possible with an endurance of 1×1014 cycles.

Figure 3:
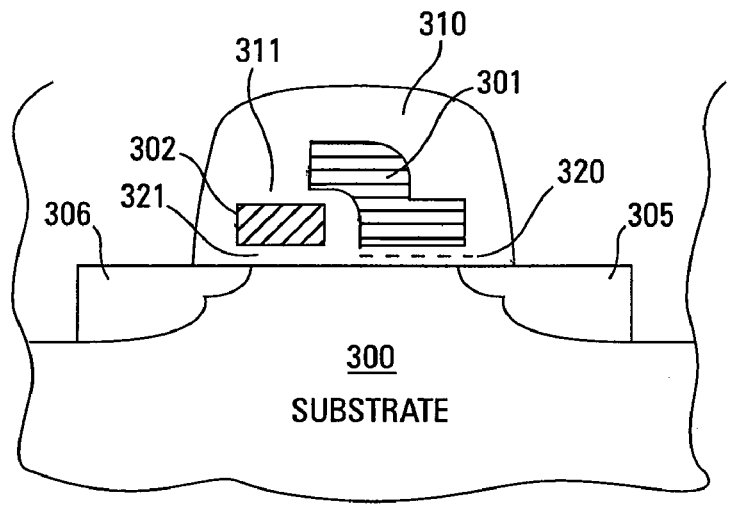
FIG. 3 shows an embodiment of a non-volatile memory cell of the present invention.

FIG. 3 illustrates a cross-sectional view of one embodiment of a conventional, non-volatile memory cell of the present invention. The NOR cell is comprised of a series integration of the fixed threshold element 311 and the bistable element 310 sharing a common source and drain. The threshold of the fixed threshold element 311, in one embodiment, is designed to be equal to or greater than the low threshold state of the bistable element 310 such that the low threshold state for the cell is defined by the threshold of the fixed threshold state. This provides minimum leakage of the cell during stand-by low state and yet is low enough to provide fast read-access speed during addressing of the memory cell.

The high state of the cell is defined by the high threshold state of the bistable element 310. As shown later in another embodiment, the position of the fixed threshold element and the bistable element (or elements) could be reversed with reference to the source, drain, and channel location. Both elements 310 and 311 are active for cell operation.

The bistable element 310 is comprised of a polysilicon control gate 301. The polysilicon control gate 301 of the bistable element 310 overlaps the polysilicon access gate 302 of the fixed threshold element 311. In the embodiment illustrated in FIG. 3, the passivation layer 104 of FIG. 1 is included in the control gate 301. The control gate/passivation layer 301 is formed over the gate insulator stack 320. In one embodiment, this is the bistable gate insulator stack illustrated in FIG. 1. This stack 320 provides ONO-type characteristics for the bistable element 310.

The fixed threshold element 311 is comprised of an access gate 302 that, in one embodiment, also includes the passivation layer 206 of FIG. 2. Thus, the access gate/passivation layer 302 is formed over the gate insulator stack of FIG. 2.

The gate insulator stack 321 is formed over a substrate 300 that, in one embodiment, is a p-type silicon material. The substrate includes two source/drain regions 305 and 306 that are doped into the substrate. In the p-type substrate embodiment, the source/drain regions 305 and 306 are n+ regions.

Charge injected from the substrate is stored in the trapping layer (101 of FIG. 1). During programming, electrons are injected from the substrate either by channel hot electrons (CHE) or by the Fowler-Nordheim tunneling. Erasing can be accomplished by Fowler-Nordheim tunneling by hole injection from the substrate into the trapping layer to compensate the stored negative charge in nitride aided by electron back-tunneling from the trapping sites.

Figure 4:
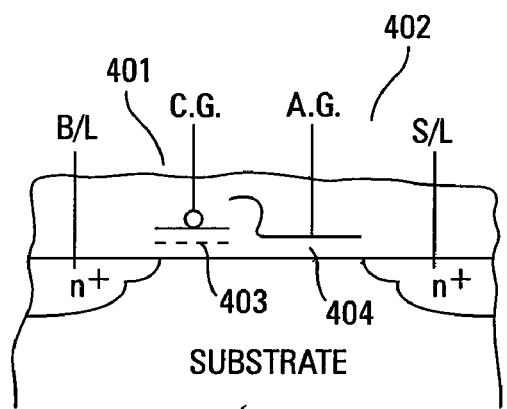
FIG. 4 shows an alternate embodiment of a non-volatile memory cell of the present invention.

FIG. 4 illustrates an embodiment of a reverse conventional non-volatile memory cell of the present invention. The cell is comprised of a fixed threshold logic element 402 and a bistable element 401.

The architecture of these elements 401 and 402 are substantially similar to that illustrated in FIG. 3. The bistable element 401 comprises the polysilicon control gate that includes the passivation layer. The gate insulator stack 403 of the bistable element is also illustrated in FIG. 1 as being comprised of the tunnel insulator, the trapping layer, and the blocking layer.

The fixed threshold element 402 of FIG. 4 is comprised of the polysilicon access gate with the passivation layer. The gate insulator stack 404 of the fixed threshold element 402 is also illustrated in FIG. 2. The difference between the embodiment of FIG. 4 and that of FIG. 3 is that the access gate overlaps the control gate of the bistable element 401.

Figure 5:
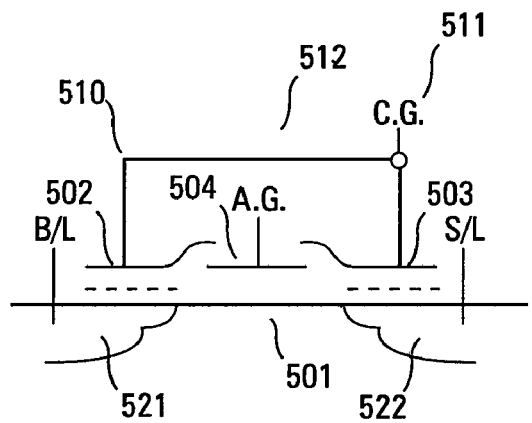
FIG. 5 shows another alternate embodiment of a non-volatile memory cell of the present invention.

FIG. 5 illustrates a non-volatile memory cell with an overlapping bistable element configuration with the center channel 501 defined by the fixed threshold element 512. The control gates 502 and 503 for the bistable elements 510 and 511 wrap over the fixed threshold gate 504 gating the center of the channel region 501.

One of the active regions 521 acts as the drain region and is coupled to the bit line (B/L). The other active region 522 acts as the source region and is coupled to the source line (S/L). The control gates 502 and 503 of each of the bistable elements 510 and 511 are coupled to a single control gate line (CG).

The gate insulator stack for the bistable elements 510 and 511 is illustrated in FIG. 1 where the passivation layer is considered to be part of the control gate. The gate insulator layer for the fixed threshold element is illustrated in FIG. 2.

Figure 6:
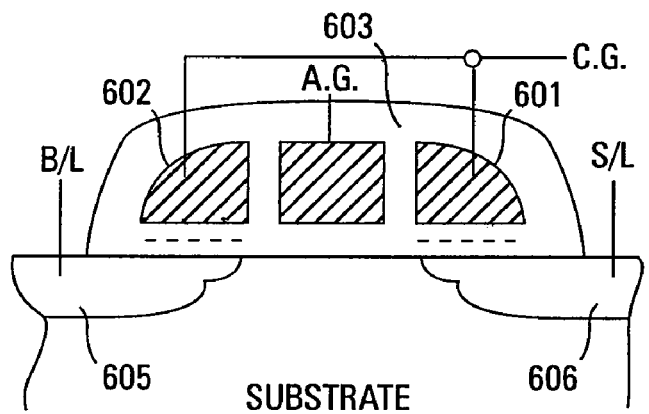
FIG. 6 shows another alternate embodiment of a non-volatile memory cell of the present invention.

FIG. 6 illustrates an embodiment for a non-volatile memory cell that is capable of storing two or more bits. The cell is comprised of two bistable elements 601 and 602 on either side of a fixed threshold logic element 603. One bistable element 602 is formed above the drain region 605 that is coupled to the bit line (B/L). The second bistable element 601 is formed above the source region 606. In one embodiment, bit line and source line operations are reversed to achieve two-bit per cell storage. In another embodiment, the trapping layers of elements 601 and 602 contain a significantly different density of traps such that the elements have different high threshold values for the same programming condition. In such an embodiment, the bit line and source lie operations are not reversed.

The bistable elements 601 and 602 are coupled to a control gate (CG) line. As in previous embodiments, the gate insulator stack for each of the bistable elements 601 and 602 are illustrated in FIG. 1.

The logic fixed threshold element 603 is coupled to an access gate (AG) line. As in the previous embodiments, the gate insulator stack for the fixed threshold element is illustrated in FIG. 2.

FIG. 7 illustrates an embodiment for a non-volatile memory cell that is capable of storing two or more data bits. The cell is comprised of two bistable elements 701 and 702 for storing data. The channel region 700 is tri-gated by the access gate of the fixed threshold element 703 and the control gates of the bistable elements 701 and 702. The two separate independent bistable element control gates are coupled to CG 'A' and CG 'B' lines respectively. The access gate of the fixed threshold logic element is coupled to an access gate AG line. The control gates of bistable elements 701 and 702 wrap over the fixed threshold gate in the non-active region.

FIG. 8 is substantially similar to the embodiment of FIG. 7 except this embodiment does not have the overlapping control gates. Otherwise, the structure and fabrication are the same.

Figure 9:
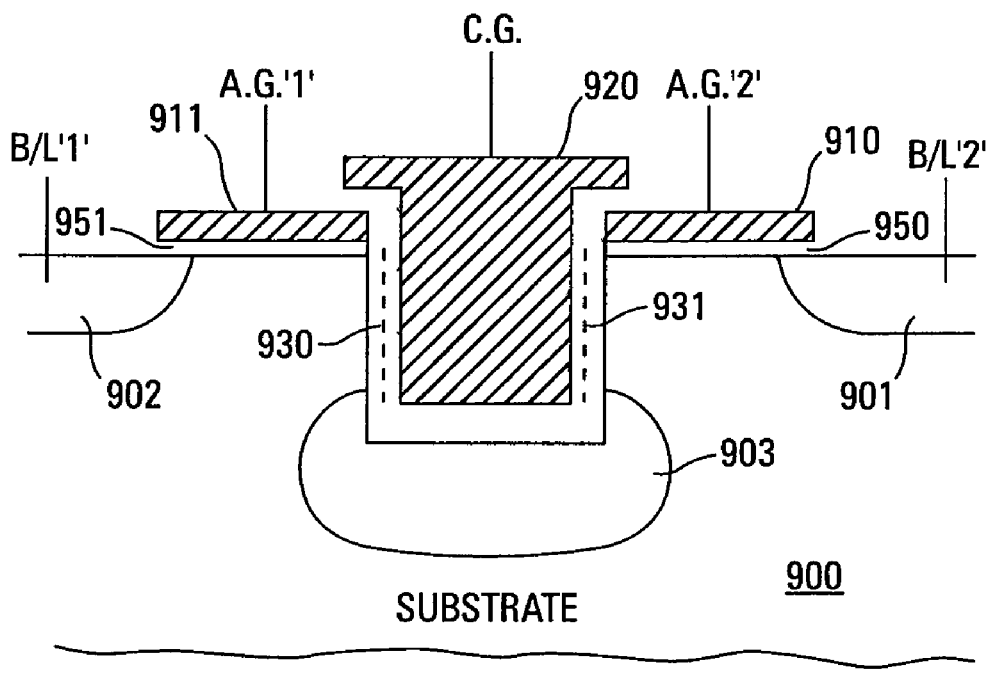
FIG. 9 shows another alternate embodiment of a non-volatile memory cell of the present invention.

FIG. 9 illustrates an embodiment for a three-dimensional, non-volatile single bit NOR memory cell of the present invention. Two cells are shown in this figure. Each cell has a bistable gate insulator stack 930 and 931, as illustrated in FIG. 1, that are formed in a vertical configuration on the opposing sidewalls of a trench. A buried common source line 903 is shared between the two adjacent cells. In one embodiment, the common source line 903 is grounded.

The control gate 920 is also shared between the adjacent cells and resides in a trench while overlapping the two adjacent access gates 910 and 911 that are formed over their respective gate insulator stacks 950 and 951 on the mesas formed by the trench. The access gates control operation of the two respective logic elements that use the gate insulator stack of FIG. 2.

The substrate 900 further has two bit lines B/L '1' and B/L '2' that are connected to their respective diffusion regions 902 and 901. In one embodiment, these active regions 901 and 902 are n+ regions in a p-type substrate. However, the present invention is not limited to any one conductivity type. The configuration illustrated in FIG. 9 yields a 4F2 cell.

Figure 10:
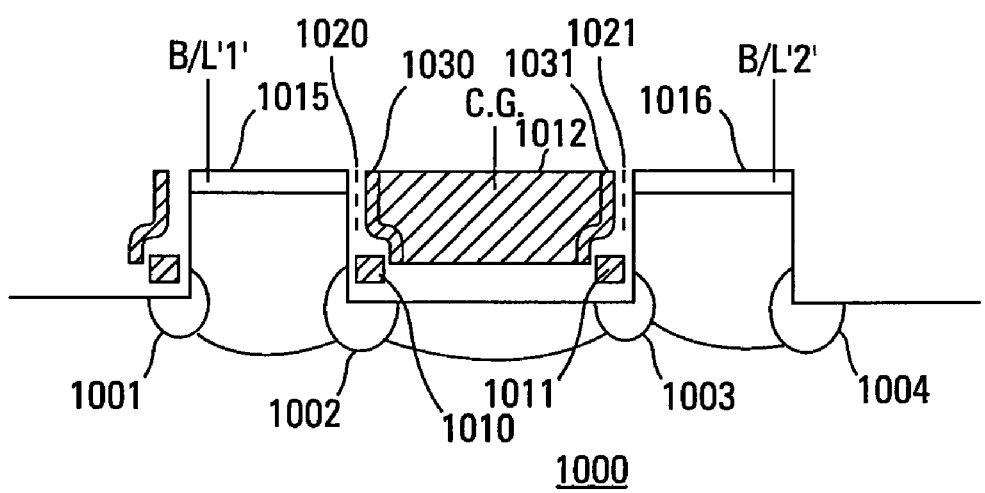
FIG. 10 shows another alternate embodiment of a non-volatile memory cell of the present invention.

FIG. 10 illustrates an embodiment for a pair of vertically configured non-volatile memory cells with a shared control gate 1012 that yields another $4F^2$ cell. Each bistable element has an insulator stack 1020 and 1021 as illustrated in FIG. 1. The control gates 1030 and 1031 of each bistable element overlap the access gates 1010 and 1011 for the fixed threshold logic elements. These elements are formed vertically in a trench formed between two mesas.

The tops of each mesa comprises diffusion regions 1015 and 1016 that act as drain regions. These regions 1015 and 1016 are connected to separate bit lines B/L '1' and B/L '2'. Buried source lines 1001-1004 are connected together and, in one embodiment, further connected to ground potential.

In one embodiment, the substrate 1000 is a p-type substrate and the active areas 1001-1004, 1015, and 1016 are n+ regions. Alternate embodiments use other conductivity types.

Figure 11:
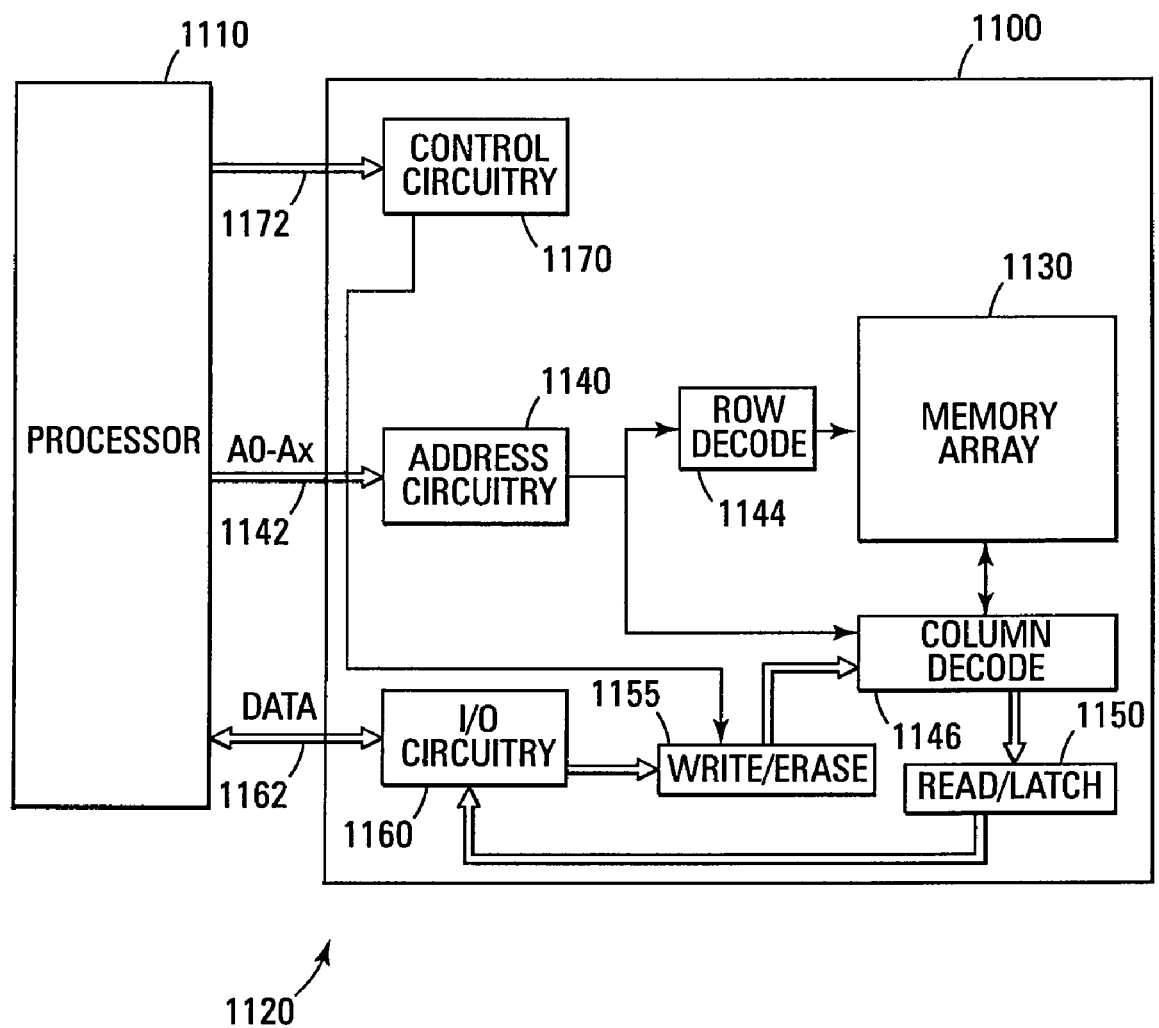
FIG. 11 shows a block diagram of one embodiment of an electronic system of the present invention.

FIG. 11 illustrates a functional block diagram of a memory device 1100 that can incorporate the non-volatile memory cells of the present invention. The memory device 1100 is coupled to a processor 1110. The processor 1110 may be a microprocessor or some other type of controlling circuitry. The memory device 1100 and the processor 1110 form part of an electronic system 1120. The memory device 1100 has been simplified to focus on features of the memory that are helpful in understanding the present invention.

The memory device includes an array of memory cells 1130 that can be comprised of the multi-level DRAM-NVRAM cells previously illustrated. The memory array 1130 is arranged in banks of rows and columns. The gates of each row of memory cells is coupled with a wordline while the drain and source connections of the memory cells are coupled to bit lines.

An address buffer circuit 1140 is provided to latch address signals provided on address input connections A0-Ax 1142. Address signals are received and decoded by a row decoder 1144 and a column decoder 1146 to access the memory array 1130. It will be appreciated by those skilled in the art, with the benefit of the present description, that the number of address input connections depends on the density and architecture of the memory array 1130. That is, the number of addresses increases with both increased memory cell counts and increased bank and block counts.

The memory device 1100 reads data in the memory array 1130 by sensing voltage or current changes in the memory array columns using sense/buffer circuitry 1150. The sense/buffer circuitry, in one embodiment, is coupled to read and latch a row of data from the memory array 1130. Data input and output buffer circuitry 1160 is included for bi-directional data communication over a plurality of data connections 1162 with the controller 1110. Write circuitry 1155 is provided to write data to the memory array.

Control circuitry 1170 decodes signals provided on control connections 1172 from the processor 1110. These signals are used to control the operations on the memory array 1130, including data read, data write (program), and erase operations. The control circuitry 1170 may be a state machine, a sequencer, or some other type of controller.

The memory device illustrated in FIG. 11 has been simplified to facilitate a basic understanding of the features of the memory. A more detailed understanding of internal circuitry and functions of memories are known to those skilled in the art.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An integrated, non-volatile memory cell comprising:
   a fixed threshold element comprising:
      a gate insulator layer formed over a substrate;
      an access gate formed over the gate insulator layer;
   a bistable element comprising:
      a tunnel insulator layer formed over the substrate;
      a charge trapping layer formed over the tunnel insulator layer;
      a charge blocking layer formed over the charge trapping layer; and
      a control gate formed over the charge blocking layer; and
   a source region and a drain region formed in the substrate;
   wherein the control gate only partially overlaps the access gate.

2. The cell of claim 1 wherein the fixed threshold element and the bistable element share a drain region and a source region.

3. The cell of claim 1 wherein the access gate is comprised of a layer of tantalum nitride between the gate insulator and a polysilicon material and the control gate is comprised of a layer of tantalum nitride between the charge blocking layer and a polysilicon material.

4. The cell of claim 1 wherein the access gate is comprised of a layer of titanium nitride between the gate insulator and a polysilicon material and the control gate is comprised of a layer of titanium nitride between the charge blocking layer and a polysilicon material.

5. The cell of claim 1 wherein the source and drain regions are n+ regions and the substrate is comprised of p-type material.

6. The cell of claim 1 wherein the fixed threshold element is configured to have a threshold that is greater than a threshold of the bistable element.

7. The cell of claim 6 wherein a low threshold state for the cell is defined by the threshold of the fixed threshold element.

8. The cell of claim 1 wherein the bistable element is configured to define a high state of the cell.

9. The cell of claim 8 wherein the a high threshold state of the bistable element defines the high state of the cell.

10. The cell of claim 1 wherein the memory cell comprises a NOR architecture.

11. The cell of claim 1 wherein both the bistable element and the fixed threshold element are active for cell operation.

12. The cell of claim 1 wherein the control gate comprises a passivation layer.

13. The cell of claim 1 wherein the tunnel insulator, charge trapping layer, and charge blocking layer comprise a bistable gate insulator stack.

14. The cell of claim 13 wherein the gate insulator stack is configured to provide ONO-type characteristics for the bistable element.

15. The cell of claim 1 wherein the access gate comprises a passivation layer.

* * * * *

UNITED STATES PATENT AND TRADEMARK OFFICE
CERTIFICATE OF CORRECTION

PATENT NO. : 8,242,554 B2  
APPLICATION NO. : 12/582024  
DATED : August 14, 2012  
INVENTOR(S) : Arup Bhattacharyya Page 1 of 1

It is certified that error appears in the above-identified patent and that said Letters Patent is hereby corrected as shown below:

On the Title Page, References Cited, Item (56), under "Other Publications", in column 2, line 2, delete "memeries," and insert -- memories, --, therefor.

On the Title Page, References Cited, Item (56), under "Other Publications", in column 2, line 6, delete "Insitiute" and insert -- Institute --, therefor.

In the Claims:

In column 9, line 11, in Claim 9, delete "the a high" and insert -- the high --, therefor.

Signed and Sealed this  
Seventh Day of May, 2013

Teresa Stanek Rea  
*Acting Director of the United States Patent and Trademark Office*